(12) United States Patent
Lower et al.

(10) Patent No.: US 8,389,374 B1
(45) Date of Patent: Mar. 5, 2013

(54) METHOD FOR PRODUCING A MICROFABRICATED IN-PLANE RADIO FREQUENCY (RF) CAPACITOR

(75) Inventors: Nathan P. Lower, North Liberty, IA (US); Mark M. Mulbrook, Marion, IA (US); Robert L. Palandech, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 287 days.

(21) Appl. No.: 12/860,259

(22) Filed: Aug. 20, 2010

(51) Int. Cl.
*H01L 31/119* (2006.01)
*H01L 29/00* (2006.01)

(52) U.S. Cl. ........ 438/396; 438/250; 438/393; 438/394; 438/397; 361/321.1; 361/321.5; 257/306; 257/369; 257/532; 257/E21.002; 257/E27.048; 257/E29.043

(58) Field of Classification Search .............. 438/250, 438/393, 394, 396, 397; 361/321.1, 321.5; 257/306, 369, 532, E21.002, E27.048, E29.043
See application file for complete search history.

(56) References Cited

U.S. PATENT DOCUMENTS

| | | | |
|---|---|---|---|
| 7,227,241 B2 * | 6/2007 | Dirnecker et al. | 257/532 |
| 7,417,302 B2 * | 8/2008 | Lee et al. | 257/532 |
| 2002/0130389 A1 * | 9/2002 | Arimochi et al. | 257/532 |
| 2011/0217793 A1 * | 9/2011 | Takahashi et al. | 438/3 |

* cited by examiner

*Primary Examiner* — Dao H Nguyen
(74) *Attorney, Agent, or Firm* — Donna P. Suchy; Daniel M. Barbieri

(57) ABSTRACT

The present invention is a method for producing a capacitor. The method includes applying a dielectric substance (ex.—silicon nitride) to a first gold seed layer, the first gold seed layer being formed on a wafer. A second gold seed layer is formed upon the dielectric substance and first gold seed layer. Gold is electroplated into a photoresist to form a first set of 3-D capacitor elements on the second gold seed layer. A first copper layer is electroplated onto the second gold seed layer. Gold is electroplated into a photoresist to form a second set of 3-D capacitor elements, the second set of 3-D elements being formed at least partially within the first copper layer and being connected to the first set of 3-D elements. A second copper layer is electroplated onto the first copper layer. Then, both copper layers are removed to provide (ex.—form) the capacitor.

14 Claims, 2 Drawing Sheets

METHOD FOR PRODUCING A MICROFABRICATED IN-PLANE RADIO FREQUENCY (RF) CAPACITOR

FIELD OF THE INVENTION

The present invention relates to the field of capacitors and particularly to a microfabricated in-plane radio frequency (RF) capacitor and process for providing same.

BACKGROUND OF THE INVENTION

Currently available passive components (ex.—capacitors) may not provide a desired capacitance range, breakdown voltage, yield level, and/or power handling capabilities.

Thus, it would be desirable to provide a fabrication process which produces a high-performance, miniaturized, passive component, which overcomes the above-referenced shortcomings of currently available passive components.

SUMMARY OF THE INVENTION

Accordingly, an embodiment of the present invention is directed to a method for producing a capacitor, including: depositing a first metal seed layer onto a wafer; applying a dielectric substance onto the first metal seed layer; depositing a second metal seed layer onto the first metal seed layer and onto the dielectric material; applying a photoresist to the second metal seed layer; patterning the photoresist on the second metal seed layer; electroplating a metal into photo-defined structures of the patterned photoresist applied to the second metal seed layer to form upon the second metal seed layer a first set of three-dimensional structural elements of the capacitor; removing the photoresist from the second metal seed layer; electroplating copper onto the second metal seed layer to form a copper layer upon the second metal seed layer; planarizing both the copper layer on the second metal seed layer and the first set of three-dimensional structural elements of the capacitor; applying a photoresist to the copper layer; patterning the photoresist applied to the copper layer; electroplating a metal into the photo-defined structures of the patterned photoresist applied to the copper layer to form a second set of three-dimensional structural elements of the capacitor, said second set of three-dimensional structural elements being embedded at least partially within the copper layer, the second set of three-dimensional structural elements being connected to the first set of three-dimensional structural elements; removing the photoresist from the copper layer; electroplating a metal onto the copper layer to form a second copper layer upon the first copper layer; planarizing the second copper layer and the second set of three-dimensional structural elements of the capacitor, the second set of three-dimensional structural elements of the capacitor being at least partially embedded within the second copper layer; removing the first copper layer and the second copper layer; and removing the second metal seed layer and the first metal seed layer to form the capacitor.

An additional embodiment of the present invention is directed to a method for producing a capacitor, including: depositing a first gold seed layer onto a wafer; applying silicon nitride to the first gold seed layer; depositing a second gold seed layer onto the first gold seed layer and onto the silicon nitride; applying a photoresist to the second gold seed layer; patterning the photoresist on the gold seed layer; electroplating gold into photo-defined structures of the patterned photoresist applied to the second gold seed layer to form upon the second gold seed layer a first set of three-dimensional gold structural elements of the capacitor; removing the photoresist from the second gold seed layer; electroplating copper onto the second gold seed layer to form a first copper layer upon the second gold seed layer; planarizing both the first copper layer on the second gold seed layer and the first set of three-dimensional gold structural elements of the capacitor; applying a photoresist to the first copper layer; patterning the photoresist applied to the first copper layer; electroplating gold into photo-defined structures of the patterned photoresist applied to the first copper layer to form a second set of three-dimensional gold structural elements of the capacitor, the second set of three-dimensional structural elements being embedded at least partially within the copper layer, the second set of three-dimensional structural elements being connected to the first set of three-dimensional structural elements; removing the photoresist from the first copper layer; electroplating gold onto the first copper layer to form a second copper layer upon the first copper layer; planarizing the second copper layer and the second set of three-dimensional gold structural elements of the capacitor, the second set of three-dimensional gold structural elements of the capacitor being at least partially embedded within the second copper layer; removing the first copper layer and the second copper layer; and removing the second gold seed layer and the first gold seed layer to form the capacitor.

A further embodiment of the present invention is directed to a three-dimensional passive component assembly, including: a wafer; a dielectric substance (ex.—silicon nitride), said dielectric substance being formed on a surface of the wafer; and a capacitor, said capacitor being formed on the surface of the wafer, said capacitor including a first set of three-dimensional structural elements and a second set of three-dimensional structural elements, the second set of three-dimensional structural elements being connected to the first set of three-dimensional structural elements, wherein the first set of three-dimensional structural elements is oriented upon the surface of the wafer such that said first set of three-dimensional structural elements is formed upon the dielectric substance.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
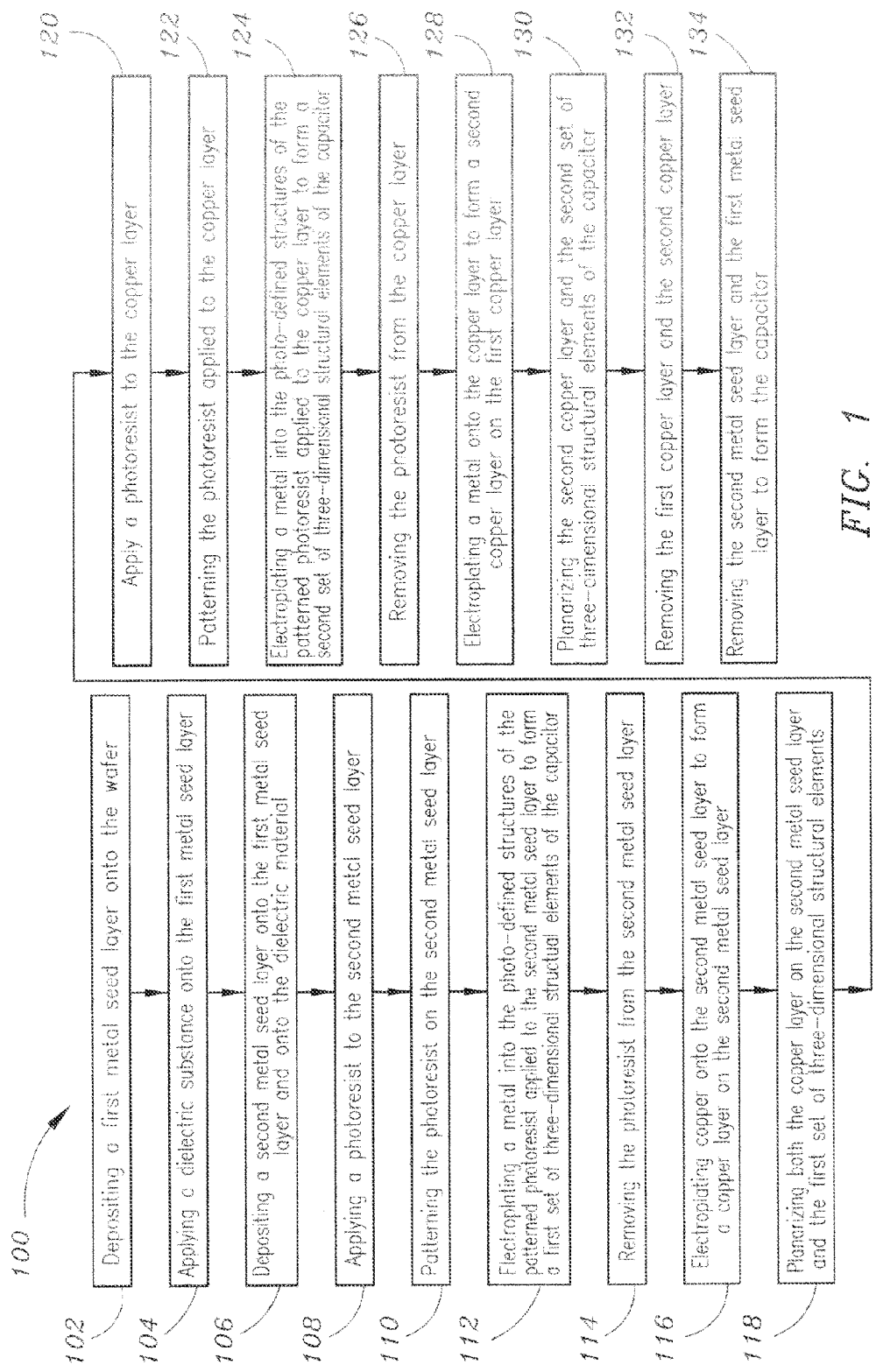
FIG. 1 depicts a flowchart illustrating a method of producing a capacitor in accordance with an exemplary embodiment of the present invention.

Referring to FIG. 1, a flowchart illustrating a method of producing a capacitor (ex.—a microfabricated in-plane radio frequency (RF) capacitor) in accordance with an exemplary embodiment of the present invention is shown. In an exemplary embodiment of the present invention, the method 100 includes the step of depositing a first conductive seed layer (ex.—a first metal seed layer) onto a wafer 102. For instance, the wafer may be formed of a dielectric material such as silicon, glass, alumina, aluminum nitride, and/or the like, while the first metal seed layer may include both a Titanium tungsten (TiW) layer (ex.—a TiW layer having a thickness of 250 angstroms) which is deposited onto the wafer, and a gold layer (ex.—a gold layer having a thickness of 5,000 angstroms) which is deposited onto the TiW layer. For example, the first conductive seed layer may be deposited onto the wafer via a physical vapor deposition (PVD) sputter process.

In current exemplary embodiments of the present invention, the method 100 may further include the step of applying a dielectric substance onto the first metal seed layer 104. For example, the dielectric substance may be aluminum oxide, silicon nitride (SiN), or diamond. Further, the dielectric substance may be applied to (ex.—formed upon) the first metal seed layer via a chemical vapor deposition (CVD) process, a lift-off lithographic process, and/or an etching (ex.—etch-define) process. In at least one embodiment of the present invention in which the dielectric substance deposited onto the first metal seed layer is silicon nitride (SiN), the dielectric substance may be formed as a 4800 angstrom thick layer.

In exemplary embodiments of the present invention, the method 100 may further include the step of depositing a second conductive seed layer (ex.—a second metal seed layer) onto the first conductive seed layer and onto the dielectric material 106. For example, the second metal seed layer may be deposited onto (ex.—formed over) the first metal seed layer and the dielectric material. Further, the second metal seed layer may include both a Titanium tungsten (TiW) layer (ex.—a TiW layer having a thickness of 250 angstroms) and a gold layer (ex.—a gold layer having a thickness of 2,000 angstroms) which is deposited onto the TiW layer of the second metal seed layer. For example, the second metal seed layer may be deposited onto the first metal seed layer and the dielectric material via a physical vapor deposition (PVD) sputter process.

In current exemplary embodiments of the present invention, the method 100 may further include the step of applying a photoresist to the second conductive seed layer 108. For example, the photoresist may be a light-sensitive material used to form a patterned coating on a surface. In further embodiments of the present invention, the method 100 may further include the step of patterning the photoresist to form a patterned coating on the second conductive seed layer 110. For instance, the patterned coating (ex.—patterned photoresist) may include (ex.—may form) a plurality of photo-defined structures which form a pattern of the patterned photoresist.

In exemplary embodiments of the present invention, the method 100 may further include the step of electroplating a metal into the photo-defined structures of the patterned photoresist applied to the second metal seed layer 112. For example, gold may be electroplated into the photo-defined structures of the patterned photoresist, and the wafer may then be lapped to remove any gold over-plating. In exemplary embodiments of the present invention, the patterned photoresist (ex.—the pattern formed by the photo-defined structures of the patterned photoresist) may be pre-selected so as to provide or form a template for allowing the gold to form (ex.—provide) a first set of three-dimensional structural elements of the in-plane single layer capacitor on the second metal seed layer when said gold is electroplated into the photo-defined structures.

In current exemplary embodiments of the present invention, the method 100 may further include the step of removing the photoresist from the second conductive seed layer 114. For instance, the photoresist may be removed via oxygen ($O_2$) plasma etching, thereby exposing the second metal seed layer and the first set of structural elements of the capacitor formed on the second metal seed layer.

In exemplary embodiments of the present invention, the method 100 may further include the step of electroplating a metal (ex.—copper) onto the second conductive seed layer to form a metal layer (ex.—copper layer) on the second conductive seed layer 116. For instance, copper may be electroplated (ex.—flood-filled) onto the wafer (ex.—onto the second conductive seed layer and at least partially onto the first set of structural elements of the capacitor). In further embodiments of the present invention, the method 100 may further include the step of planarizing the wafer 118 (ex.—planarizing the copper and the first set of gold three-dimensional structural elements of the capacitor) thereby forming a copper layer, the first set of gold three-dimensional structural elements of the capacitor being at least partially embedded in the copper layer.

In current exemplary embodiments of the present invention, the method 100 may further include the step of applying a photoresist to the copper layer 120. In further embodiments of the present invention, the method 100 may further include the step of patterning the photoresist applied to the copper layer to form a patterned coating on the copper layer 122. For instance, the patterned coating (ex.—patterned photoresist) on the copper layer may include a plurality of photo-defined structures which form a pattern of the patterned photoresist. Further, the pattern formed by the photo-defined structures of the patterned photoresist which is formed on the copper layer may be a same or different pattern than the pattern formed by the photo-defined structures of the patterned photoresist which was formed on (ex.—applied to) the second seed layer, depending on the shape, size and pattern of the three-dimensional structural elements of the capacitor which are to be formed using said photoresist applied to the copper layer.

In exemplary embodiments of the present invention, the method 100 may further include the step of electroplating a metal into the photo-defined structures of the patterned photoresist applied to the copper layer 124. For example, gold may be electroplated into the photo-defined structures of the patterned photoresist to form a second set of three-dimensional structural elements of the capacitor. For instance, the second set of three-dimensional structural elements may be formed at least partially within and/or on the copper layer. Further, the second set of three-dimensional structural elements may be formed upon (exs—may be built upon, may be fused with, may be connected to, may be extensions of) the first set of three-dimensional structural elements of the capacitor.

In current exemplary embodiments of the present invention, the method 100 may further include the step of removing the photoresist from the copper layer 126. For instance, the photoresist may be removed via oxygen ($O_2$) plasma etching, thereby exposing the copper layer and the second set of structural elements of the capacitor formed at least partially within the copper layer.

In exemplary embodiments of the present invention, the method 100 may further include the step of electroplating a metal (ex.—copper) onto the copper layer to form a second copper layer on the first copper layer 128. For instance, copper may be electroplated (ex.—flood-filled) onto the wafer (ex.—onto the copper layer and at least partially onto the second set of structural elements of the capacitor). In further embodiments of the present invention, the method 100 may further include the step of planarizing the wafer 130 (ex.— planarizing the copper (ex.—the second copper layer) which has been electroplated onto the copper layer and the second set of gold three-dimensional structural elements of the capacitor), the second set of gold three-dimensional structural elements of the capacitor being at least partially embedded in the second copper layer.

In current exemplary embodiments of the present invention, the method 100 may further include the step of removing the first copper layer and the second copper layer 132. For example, the copper layers may be chemically removed, thereby exposing second metal seed layer. In further embodiments of the present invention, the method 100 may further include the step of removing the second metal seed layer and the first metal seed layer 134. For instance, the second metal seed layer and the first metal seed layer may be removed via chemical etching, thereby exposing (ex.—isolating) the first set of three-dimensional structural elements of the capacitor and the second set of three-dimensional structural elements of the capacitor (ex.—thereby forming the capacitor). In further embodiments, the first and second sets of three-dimensional structural elements collectively form the capacitor (exs.— passive device, microfabricated in-plane radio frequency (RF) single layer capacitor). Further, the capacitor, the wafer (ex.—substrate) upon which the capacitor is formed, and the dielectric substance (which is formed upon the wafer) collectively forms a three-dimensional passive component assembly (as shown in FIG. 2).

Figure 2:
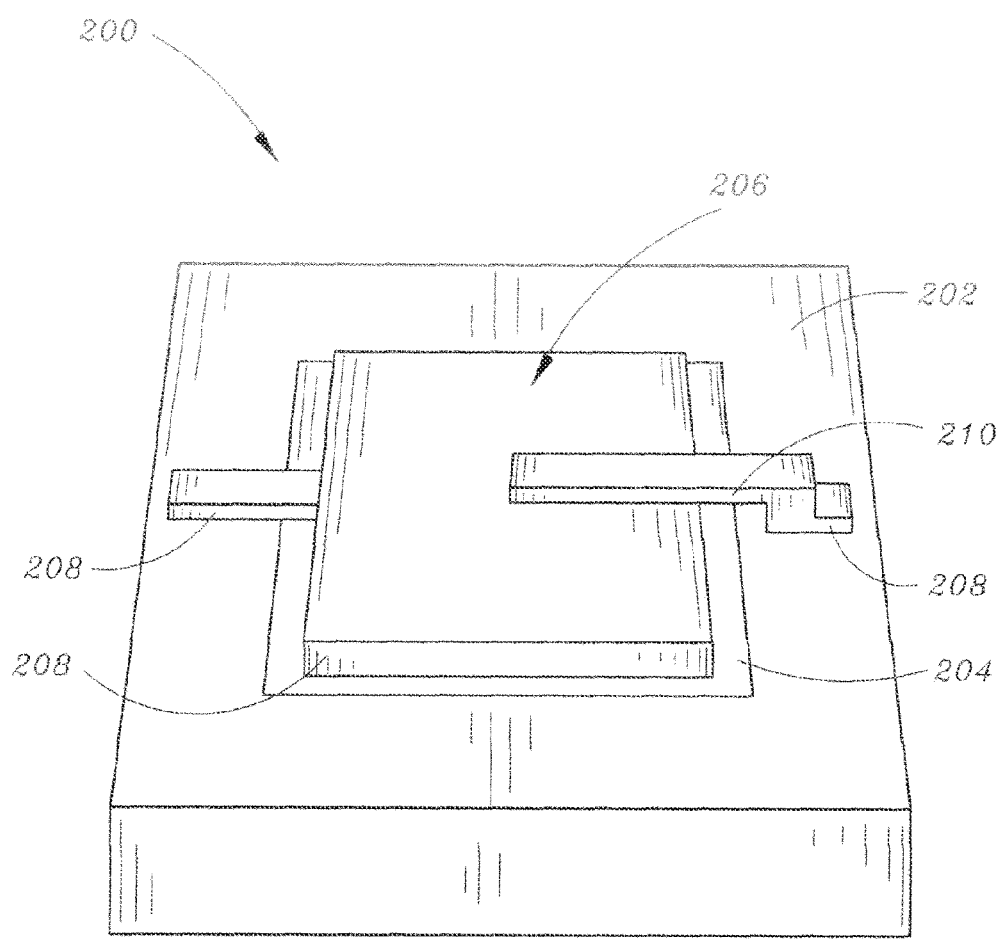
FIG. 2 is an isometric view of an in-plane, single layer capacitor produced via the process depicted in FIG. 1, in accordance with an exemplary embodiment of the present invention.

Referring to FIG. 2, in exemplary embodiments of the present invention, a three-dimensional passive component assembly 200, as formed by the method 100 described above, is shown. The three-dimensional passive component assembly 200 includes the wafer 202. The assembly 200 further includes a dielectric substance 204 formed on a top surface of the wafer 202. The assembly 200 further includes a capacitor 206 (ex.—a microfabricated in-plane radio frequency (RF) single layer capacitor) formed upon the top surface of the wafer 202, said capacitor including a first set of three-dimensional structural elements 208 and a second set of three-dimensional structural elements 210, the second set of three-dimensional structural elements 210 being connected to (ex.—formed upon) the first set of three-dimensional structural elements. Further, the first set of three-dimensional structural elements 208 is oriented upon the top surface of the wafer 202 such that said first set of structural elements 208 of the capacitor 206 is formed upon the dielectric substance 204 formed on the top surface of the wafer 202. In further embodiments of the present invention, the capacitor 206 formed by the method 100 described above may have a breakdown voltage of one-hundred ninety volts. In still further embodiments of the present invention, the method 100 described above may promote production of a capacitor (ex.—an in-plane single layer capacitor) which has fewer metal layers and thicker structural elements (ex.—metal leads) than currently available capacitors.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for producing a capacitor, comprising:
   depositing a first metal seed layer onto a wafer;
   applying a dielectric substance onto the first metal seed layer;
   depositing a second metal seed layer onto the first metal seed layer and onto the dielectric material;
   applying a photoresist to the second metal seed layer;
   patterning the photoresist on the second metal seed layer;
   electroplating a metal into photo-defined structures of the patterned photoresist applied to the second metal seed layer to form upon the second metal seed layer a first set of three-dimensional structural elements of the capacitor;
   removing the photoresist from the second metal seed layer; and
   electroplating copper onto the second metal seed layer to form a copper layer upon the second metal seed layer.

2. A method as claimed in claim 1, further comprising:
   planarizing both the copper layer on the second metal seed layer and the first set of three-dimensional structural elements of the capacitor.

3. A method as claimed in claim 2, further comprising:
   applying a photoresist to the copper layer.

4. A method as claimed in claim 3, further comprising:
   patterning the photoresist applied to the copper layer.

5. A method as claimed in claim 4, further comprising:
   electroplating a metal into the photo-defined structures of the patterned photoresist applied to the copper layer to form a second set of three-dimensional structural elements of the capacitor, said second set of three-dimensional structural elements being embedded at least partially within the copper layer, the second set of three-dimensional structural elements being connected to the first set of three-dimensional structural elements.

6. A method as claimed in claim 5, further comprising:
   removing the photoresist from the copper layer.

7. A method as claimed in claim 6, further comprising:
   electroplating a metal onto the copper layer to form a second copper layer upon the first copper layer.

8. A method as claimed in claim 7, further comprising:
   planarizing the second copper layer and the second set of three-dimensional structural elements of the capacitor, the second set of three-dimensional structural elements of the capacitor being at least partially embedded within the second copper layer.

9. A method as claimed in claim 8, further comprising:
   removing the first copper layer and the second copper layer.

10. A method as claimed in claim 9, further comprising:
    removing the second metal seed layer and the first metal seed layer to form the capacitor.

11. A method for producing a capacitor, comprising:
    depositing a first gold seed layer onto a wafer;

applying silicon nitride to the first gold seed layer;
depositing a second gold seed layer onto the first gold seed layer and onto the silicon nitride;
applying a photoresist to the second gold seed layer;
patterning the photoresist on the gold seed layer; and
electroplating gold into photo-defined structures of the patterned photoresist applied to the second gold seed layer to form upon the second gold seed layer a first set of three-dimensional gold structural elements of the capacitor.

12. A method as claimed in claim 11, further comprising:
removing the photoresist from the second gold seed layer;
electroplating copper onto the second gold seed layer to form a first copper layer upon the second gold seed layer;
planarizing both the first copper layer on the second gold seed layer and the first set of three-dimensional gold structural elements of the capacitor; and
applying a photoresist to the first copper layer.

13. A method as claimed in claim 12, further comprising:
patterning the photoresist applied to the first copper layer;
electroplating gold into photo-defined structures of the patterned photoresist applied to the first copper layer to form a second set of three-dimensional gold structural elements of the capacitor, the second set of three-dimensional structural elements being embedded at least partially within the copper layer, the second set of three-dimensional structural elements being connected to the first set of three-dimensional structural elements; and
removing the photoresist from the first copper layer.

14. A method as claimed in claim 13, further comprising:
electroplating gold onto the first copper layer to form a second copper layer upon the first copper layer;
planarizing the second copper layer and the second set of three-dimensional gold structural elements of the capacitor, the second set of three-dimensional gold structural elements of the capacitor being at least partially embedded within the second copper layer;
removing the first copper layer and the second copper layer; and
removing the second gold seed layer and the first gold seed layer to form the capacitor.

* * * * *